(12) United States Patent
Liu et al.

(10) Patent No.: US 12,228,826 B2
(45) Date of Patent: Feb. 18, 2025

(54) ARRAY SUBSTRATE AND DISPLAY DEVICE

(71) Applicants: WUHAN BOE OPTOELECTRONICS TECHNOLOGY CO., LTD., Hubei (CN); BOE TECHNOLOGY GROUP CO., LTD., Beijing (CN)

(72) Inventors: Jingang Liu, Beijing (CN); Yuanhui Guo, Beijing (CN); Xia Shi, Beijing (CN); Peng Jiang, Beijing (CN); Yanping Liao, Beijing (CN)

(73) Assignees: WUHAN BOE OPTOELECTRONICS TECHNOLOGY CO., LTD., Hubei (CN); BOE TECHNOLOGY GROUP CO., LTD., Beijing (CN)

( * ) Notice: Subject to any disclaimer, the term of this patent is extended or adjusted under 35 U.S.C. 154(b) by 155 days.

(21) Appl. No.: 17/914,388

(22) PCT Filed: Nov. 19, 2021

(86) PCT No.: PCT/CN2021/131718
§ 371 (c)(1),
(2) Date: Sep. 26, 2022

(87) PCT Pub. No.: WO2022/193710
PCT Pub. Date: Sep. 22, 2022

(65) Prior Publication Data
US 2023/0110276 A1    Apr. 13, 2023

(30) Foreign Application Priority Data
Mar. 19, 2021 (CN) .......................... 202110296865.7

(51) Int. Cl.
G02F 1/1362    (2006.01)
G02F 1/1339    (2006.01)
H01L 27/12     (2006.01)

(52) U.S. Cl.
CPC .... *G02F 1/13394* (2013.01); *G02F 1/136286* (2013.01); *H01L 27/124* (2013.01); *G02F 2201/121* (2013.01); *G02F 2202/02* (2013.01)

(58) Field of Classification Search
CPC .................................................... G02F 1/1362
See application file for complete search history.

(56) References Cited

U.S. PATENT DOCUMENTS 9,437,487 B2   9/2016   Shu et al.
9,673,231 B2   6/2017   Shu et al.
(Continued)

FOREIGN PATENT DOCUMENTS

CN    102707523 A    10/2012
CN    103336396 A    10/2013
(Continued)

OTHER PUBLICATIONS

International Search Report from PCT/CN2021/131718 dated Feb. 23, 2022.
Written Opinion from PCT/CN2021/131718 dated Feb. 23, 2022.

*Primary Examiner* — Sang V Nguyen
(74) *Attorney, Agent, or Firm* — Calfee, Halter & Griswold LLP (57) ABSTRACT

The present disclosure relates to the field of display technology, in particular, to an array substrate and a display device. The array substrate includes: a first substrate; a transistor, formed on the first substrate; an organic insulation layer, formed on the first substrate and covering the transistor; a spacer, formed on a side of the organic insulation layer away from the first substrate, where an orthographic (Continued)

projection of the spacer on the first substrate at least partially overlaps with an orthographic projection of the transistor on the first substrate.

18 Claims, 3 Drawing Sheets

(56) References Cited

U.S. PATENT DOCUMENTS

| | | | |
|---|---|---|---|
| 10,698,281 B2 | 6/2020 | Morinaga et al. | |
| 10,948,789 B2 | 3/2021 | Park et al. | |
| 2014/0160401 A1* | 6/2014 | Yonemura | G02F 1/133512 349/138 |
| 2015/0108486 A1* | 4/2015 | Um | G02F 1/1368 257/72 |
| 2015/0205154 A1* | 7/2015 | Koo | G09G 3/36 349/42 |
| 2016/0148838 A1 | 5/2016 | Shu et al. | |
| 2016/0351588 A1* | 12/2016 | Shu | G02F 1/1368 |
| 2017/0131608 A1* | 5/2017 | Jin | G09G 3/3648 |
| 2018/0149931 A1* | 5/2018 | Xu | G02F 1/134336 |
| 2018/0275471 A1 | 9/2018 | Park et al. | |
| 2019/0033636 A1 | 1/2019 | Morinaga et al. | |
| 2019/0219865 A1 | 7/2019 | Yu | |
| 2019/0227365 A1* | 7/2019 | Park | G02F 1/133512 |
| 2020/0166796 A1* | 5/2020 | Okuyama | G02F 1/1334 |
| 2021/0173271 A1* | 6/2021 | Long | G02F 1/13624 |

FOREIGN PATENT DOCUMENTS

| | | |
|---|---|---|
| CN | 104007574 A | 8/2014 |
| CN | 104360557 A | 2/2015 |
| CN | 106154662 A | 11/2016 |
| CN | 107505780 A | 12/2017 |
| CN | 108474985 A | 8/2018 |
| CN | 108628030 A | 10/2018 |
| CN | 111045267 A | 4/2020 |
| CN | 111580311 A | 8/2020 |
| EP | 3379328 A1 | 9/2018 |

* cited by examiner

ARRAY SUBSTRATE AND DISPLAY DEVICE

CROSS REFERENCE

The present disclosure is a National Stage of International Application No. PCT/CN 2021/131718 filed on Nov. 19, 2021, which claims priority to Chinese Patent Application No. 202110296865.7 entitled "Array substrate and display device", filed on Mar. 19, 2021, and both the entire contents of which are incorporated herein by reference.

TECHNICAL FIELD

The present disclosure relates to the field of display technology, and in particular, to an array substrate and a display device.

BACKGROUND

Liquid crystal display (LCD) is an important flat-panel display device, which has been widely used in mobile phones, vehicles, displays, televisions and public displays, and the market has an increasing demand for large-size LCD panels.

SUMMARY

According to a first aspect of the present disclosure, there is provided an array substrate including:
a first substrate;
a transistor, formed on the first substrate;
an organic insulation layer, formed on the first substrate and covering the transistor;
a spacer, formed on a side of the organic insulation layer away from the first substrate, where, an orthographic projection of the spacer on the first substrate at least partially overlaps with an orthographic projection of the transistor on the first substrate.

In some embodiments of the present disclosure, the array substrate further includes a pixel electrode and a common electrode,
an orthographic projection of the pixel electrode on the first substrate partially overlaps with an orthographic projection of the common electrode on the first substrate, and the pixel electrode is connected to a first electrode of the transistor;
one of the pixel electrode and the common electrode is located on a side of the organic insulation layer close to the first substrate, and the other one of the pixel electrode and the common electrode is located on a side of the organic insulation layer away from the first substrate.

In some embodiments of the present disclosure, the organic insulation layer includes a first organic insulation portion and a second organic insulation portion,
an orthographic projection of the first organic insulation portion on the first substrate covers the orthographic projection of the transistor on the first substrate;
an orthographic projection of the second organic insulation portion on the first substrate covers an orthographic projection of the pixel electrode and the common electrode on the first substrate;
where a thickness of the first organic insulation portion is greater than a thickness of the second organic insulation portion.

In some embodiments of the present disclosure, a ratio of the thickness of the first organic insulation portion to the thickness of the second organic insulation portion is 2 to 4.

In some embodiments of the present disclosure, the thickness of the first organic insulation portion is 1 µm to 3 µm; and the thickness of the second organic insulation portion is 0.8 µm to 1.5 µm.

In some embodiments of the present disclosure, it is further included that: a data line extending in a column direction and a scanning line extending in a row direction, where the scanning line is connected to a gate of the transistor, and the data line is connected to a second electrode of the transistor;
where, the orthographic projection of the spacer on the first substrate at least partially overlaps with an orthographic projection of the data line on the first substrate, and at least partially overlaps with an orthographic projection of the scanning line on the first substrate.

In some embodiments of the present disclosure, a ratio of a width of the scanning line to the thickness of the first organic insulation portion is 3 to 20; and a ratio of a width of the data line to the thickness of the first organic insulation portion is 1.5 to 6.5.

In some embodiments of the present disclosure, the width of the scanning line is 10 µm to 20 µm, and the width of the data line is 5 µm to 6.5 µm.

In some embodiments of the present disclosure, a part of the scanning line is configured to form the gate of the transistor, and the data line is arranged on a same layer as the second electrode and the first electrode of the transistor and is connected to the second electrode of the transistor.

In some embodiments of the present disclosure, the common electrode is located on the side of the organic insulation layer close to the first substrate; and the pixel electrode is located on the side of the organic insulation layer away from the first substrate;
where, the pixel electrode comprises a first portion and a second portion arranged in a column direction and integrally formed; the first portion comprises a first electrode strip and a first slit alternately arranged in the column direction; the second portion comprises a second electrode strip and a second slit alternately arranged in the column direction; the first electrode strip and the first slit extend along a third direction; the second electrode strip and the second slit extend along a fourth direction; and the third direction and the fourth direction intersect with each other and are mirror symmetric with respect to a row direction.

In some embodiments of the present disclosure, the first electrode strip and the second electrode strip are disconnected in at least a middle area of a junction region where the first part and the second part meet.

In some embodiments of the present disclosure, the array substrate further comprises a common line extending in the row direction, the common line and the gate of the transistor are arranged on a same layer, an orthographic projection of the common line on the first substrate does not overlap with the orthographic projection of the gate of the transistor on the first substrate;
where, a part of the common line is located on a side of the common electrode away from the first substrate and is in contact with the common electrode.

In some embodiments of the present disclosure, an orthographic projection of a surface of the spacer away from the first substrate on the first substrate locates within an orthographic projection of a surface of the spacer close to the first substrate on the first substrate.

In some embodiments of the present disclosure, the spacer is in contact with the organic insulation layer.

According to a second of the present disclosure, there is provided a display device, comprising any one of the above array substrates and an alignment substrate in cell alignment with the array substrate.

Other features and advantages of the present disclosure will become apparent from the following detailed description, or may be learned in part by the practice of the present disclosure.

It should be understood that the above general description and the following detailed description are exemplary and explanatory, and do not limit the present disclosure.

BRIEF DESCRIPTION OF THE DRAWINGS

The accompanying drawings, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skill in the art, other drawings can also be obtained from these drawings without creative efforts.

DESCRIPTION OF REFERENCE MARKS

1. Array substrate; 10. First substrate; 11. Transistor; 110. First electrode; 111. Second electrode; 112. Active layer; 12. Organic insulation layer; 120. First organic insulation portion; 121. Second organic insulation portion; 13. Spacer; 14. Pixel electrode; 140. First portion; 140a. First electrode strip; 140b. First slit; 141. Second portion; 141a. Second electrode strip; 141b. Second slit; 15. Common electrode; 16. Data line; 17. Scanning line; 18. Common line; 19. Gate insulation layer;

2. Alignment substrate; 20. Second substrate; 21. Shielding layer; 210. Shielding region; 211. Light transmitting region; 22. Color film layer; 23. Transparent protective layer.

DETAILED DESCRIPTION

The technical solution will be described more fully with reference to the accompanying drawings. In the description, the same or similar reference numerals indicate the same or similar components. The following description of the embodiments of the present disclosure with reference to the accompanying drawings is intended to explain the general inventive concept of the present disclosure and should not be construed as a limitation of the present disclosure.

In addition, in the following detailed description, for convenience of explanation, many specific details are set forth to provide a comprehensive understanding of the embodiments of the present disclosure. However, it is obvious that one or more embodiments may be implemented without these specific details.

At present, liquid crystal display has problems such as low transmittance and easy light leakage after collision. An object of the embodiments of the present disclosure is to provide an array substrate and a display device, so as to overcome one or more problems caused by the limitations and defects of the related art at least to a certain extent.

According to some embodiments of the present disclosure, there is provided an array substrate, which can be applied to a display device, for example, to a liquid crystal display device. As can be seen from FIG. 1 and FIG. 2, the array substrate 1 according to embodiments of the present disclosure may include a first substrate 10, a sub-pixel unit, an organic insulation layer 12, and a spacer 13. The sub-pixel unit may include at least one transistor 11, which may be formed on the first substrate 10. The organic insulation layer 12 may be formed on the first substrate 10 and cover the transistor 11. The spacer 13 may be formed on the side of the organic insulation layer 12 away from the first substrate 10, and the orthographic projection of the spacer 13 on the first substrate 10 at least partially overlaps with the orthographic projection of the transistor 11 on the first substrate 10.

In some embodiments of the present disclosure, the transistor 11 is covered with an organic insulating material, that is, the organic insulation layer 12. The flatness of the side of the array substrate 1 can be improved compared with the scheme of covering the transistor 11 with an inorganic material such as silicon nitride, so as to facilitate the spacer 13 to be located on the array substrate 1. That is, the spacer 13 is integrated on the array substrate 1, and the surface of the spacer 13 away from the first substrate can be in contact with the alignment substrate. It should be noted that the film structure of the alignment substrate is less than that of the array substrate 1, and the flatness of the alignment substrate as a whole is better than that of the array substrate 1. That is to say, the friction between the spacer 13 and the alignment substrate at the contact position is smaller, so that the spacer 13 can be quickly reset after sliding, so as to alleviate the light leakage easily caused collision or extrusion of the panel.

In the present disclosure, the flatness of both sides of the spacer 13 can be ensured by replacing the material covering the transistor 11 with the organic insulating material and locating the spacer on the array substrate 1. Compared with the scheme of locating the spacer 13 on the alignment substrate, it can be ensured that the spacer 13 can be quickly reset after the panel is subjected to collision or extrusion, and at the same time, it does not need to provide additional structures on the array substrate 1 to ensure its flatness. Therefore, it can also improve the opening rate of the panel.

In addition, it should be understood that the transistor 11 is located in the shielding region. Therefore, by at least partially overlapping the orthographic projection of the spacer 13 on the first substrate 10 and the orthographic projection of the transistor 11 on the first substrate 10, which can be understood as the spacer 13 locates in the region where the transistor 11 is located, the area of the shielding region can be reduced, so that the opening rate of the panel can be improved, and thus the transmittance of the panel can be improved.

In some embodiments of the present disclosure, the sub-pixel unit may further include a common electrode 15 and a pixel electrode 14 in addition to the aforementioned transistor 11. The array substrate 1 may further include a scanning line 17, a data line 16, a common line 18 in addition to the aforementioned first substrate 10, the sub-pixel unit, the organic insulation layer 12, and the spacer 13.

The array substrate 1 according to the embodiments of the present disclosure will be described in detail below in conjunction with the accompanying drawings.

Figure 1:
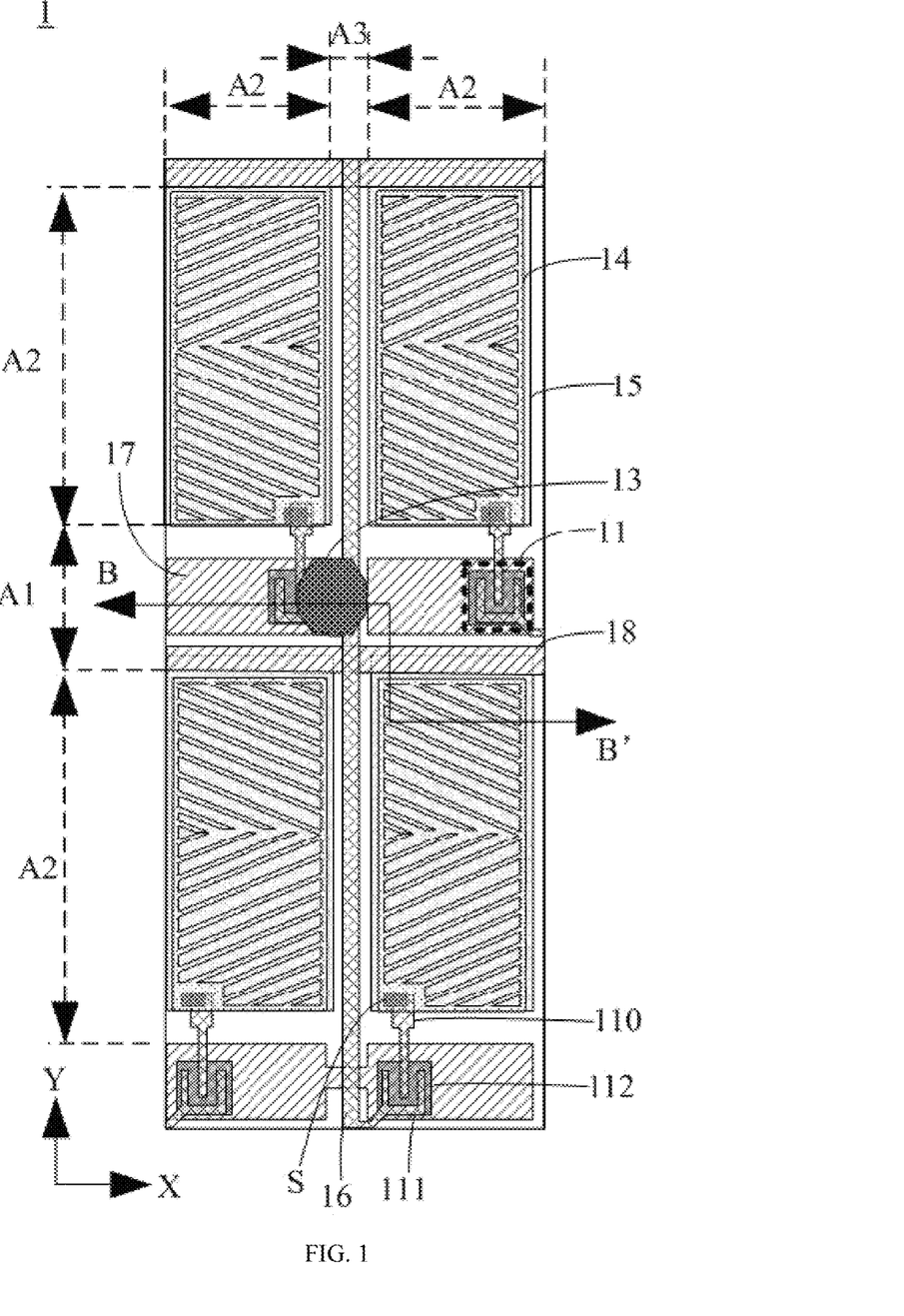
FIG. 1 is a structural schematic diagram of the array substrate according to an embodiment of the present disclosure.

In some embodiments of the present disclosure, as shown in FIG. 1, the first substrate 10 may include a plurality of sub-pixel regions A2 arranged in an array along the row direction X and the column direction Y, a plurality of rows of first wiring regions A1, and a plurality of columns of second wiring regions A3. The first wiring regions A1 and the sub-pixel regions A2 are alternately arranged in the column direction Y, and the second wiring regions A3 and the sub-pixel regions A2 are alternately arranged in the row direction X. It should be understood that, there is an overlap between the first wiring regions A1 and the second wiring regions A3.

For example, the first substrate 10 may be a single-layer structure, and the material of the first substrate 10 may be glass, to which it is not limited. The first substrate 10 may also be a multilayer structure. The material of the first substrate 10 is not limited to glass, and may also be other materials, such as polyimide (PI), which may depend on specific situation.

In some embodiments of the present disclosure, as shown in FIG. 1, the scanning line 17 may extend in the row direction X as a whole, and the scanning line 17 may be located in the first wiring region A1 for providing a scanning signal to the sub-pixel unit. For example, a plurality of rows of scanning lines 17 may be provided, and one row of scanning lines 17 may be provided on each of the first wiring regions A1, which is not limited to this and two or more rows of scanning lines 17 may be provided.

In some embodiments of the present disclosure, as shown in FIG. 1, the common line 18 may extend in the row direction X as a whole, and the common line 18 may be located in the first wiring region A1 for providing a common signal to the sub-pixel unit. For example, a plurality of rows of common lines 18 may be provided, and one row of common lines 18 may be provided on each of the first wiring regions A1, which is not limited to this and two or more rows of common lines 18 may be provided.

The common line 18 and the scanning line 17 may be arranged on the same layer to simplify the process and reduce the cost. It should be noted that, as shown in FIG. 1, on each first wiring region A1, the orthographic projection of the common line 18 on the first substrate 10 and the orthographic projection of the scanning line 17 on the first substrate 10 do not overlap with each other and are spaced apart from each other. That is, the orthographic projection of the common line 18 on the first substrate 10 and the orthographic projection of the gate of the transistor 11 on the first substrate 10 do not overlap with each other.

In addition, it should be understood that in the present disclosure, the structure arranged on the same layer refers to a layer structure formed by using a same film forming process to form a film layer for forming a specific pattern, and then using a same mask through a single patterning process. That is, a single patterning process corresponds to one mask (also known as a photomask). According to different specific patterns, a single patterning process may include multiple exposure, development or etching processes, and the specific patterns in the formed layer structure may be continuous or discontinuous, and these specific patterns may also be at different heights or have different thicknesses, thereby simplifying the manufacturing process, saving the manufacturing cost and improving the production efficiency.

For example, the common line 18 and the scanning line 17 in some embodiments of the present disclosure may be made of metal or alloy materials, such as molybdenum, aluminum and titanium and the like, to ensure its good electrical conductivity, but it is not limited to this, and may also be made of other materials with good electrical conductivity.

In some embodiments of the present disclosure, as shown in FIG. 1, the data line 16 may extend in the column direction Y as a whole, and the data line 16 may be located in the second wiring region A3 for providing a data signal to the sub-pixel unit. For example, the data line 16 may be provided in a plurality of columns, and one row of data line 16 may be provided on each second wiring region A3, which is not limited to this and two or more rows of data lines 16 may be provided.

Figure 2:
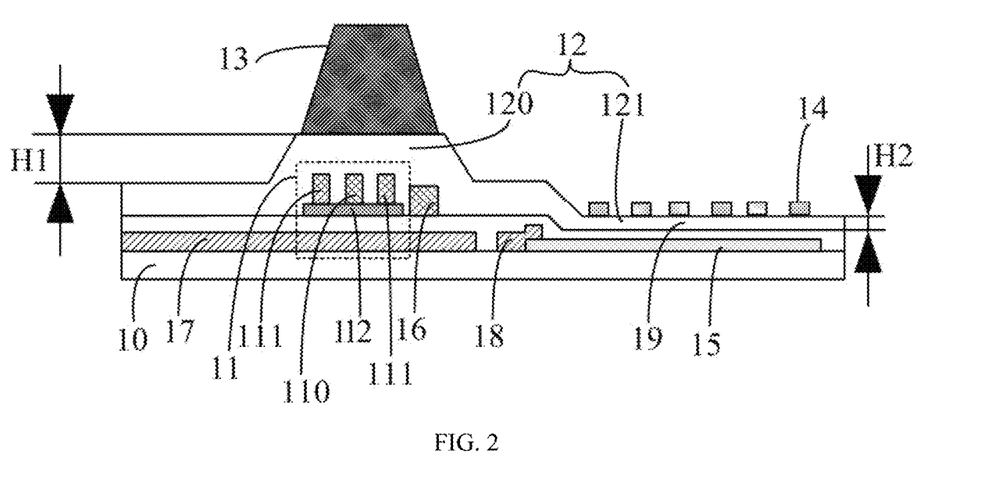
FIG. 2 is a schematic cross-sectional view of the array substrate along the B-B' direction shown in FIG. 1.

For example, the data line 16 may be located on the side of the scanning line 17 and the common line 18 away from the first substrate 10, and a gate insulation layer 19 is provided between the data line 16 and the scanning line 17 and the common line 18, as shown in FIG. 2, to avoid the data line 16 from contacting with the scanning line 17 and the common line 18. The data line 16 may be made of a metal material or an alloy material, such as a metal single-layer or multilayer structure formed of molybdenum, aluminum and titanium, and the multilayer structure is a stack of multi-metal layers, such as a stack of three-metal layers of titanium, aluminum, and titanium (Ti/Al/Ti).

It should be understood that the gate insulation layer 19 mentioned in some embodiments of the present disclosure can be provided on the array substrate 1 in a whole layer, and the gate insulation layer 19 can be made of inorganic materials, such as silicon oxide, silicon nitride and other inorganic materials.

In some embodiments of the present disclosure, a plurality of sub-pixel units may be arranged in an array along the row direction X and the column direction Y, and the sub-pixel unit may be in one to one correspondence to the sub-pixel region A2, that is, each sub-pixel unit is correspondingly arranged on one sub-pixel region A2. Specifically, at least part of the common electrode 15 and the pixel electrode 14 of each sub-pixel unit may be located on one sub-pixel region A2, and at least part of the transistor 11 of each sub-pixel unit may be located on the first wiring region A1.

As shown in FIG. 1 and FIG. 2, the transistor 11 may include an active layer 112, a gate, a second electrode 111 and a first electrode 110 arranged on the same layer. The gate insulation layer 19 may be provided between the gate and the active layer 112 to insulate the gate and the active layer 112 from each other. The thickness of the gate insulation layer 19 may be in the range of 0.4 μm, but it is not limited to this. For example, the gate of the embodiments of the present disclosure and the aforementioned scanning line 17 may be arranged on the same layer and connected to each other. In other words, the gate may be part of the structure of the aforementioned scanning line 17. The second electrode 111 and the first electrode 110 may be respectively connected to the source doped region and the drain doped region of the active layer 112.

Among them. the second electrode 111 and the first electrode 110 may be arranged on the same layer as the aforementioned data line 16, so as to simplify the process and reduce the cost.

For example, the transistor 11 of the embodiments of the present disclosure may be of a bottom gate type. That is, the gate may be formed on the first substrate 10 firstly; then the gate insulation layer 19 is formed on the first substrate 10, and the gate insulation layer 19 covers the gate electrode; and then, the active layer 112 is formed on the side of the gate insulation layer 19 away from the first substrate 10, that is, the active layer 112 is located on the side of the gate away from the first substrate 10, and the active layer 112 overlaps with the orthographic projection of the gate on the first substrate 10. For example, the orthographic projection of the active layer 112 on the first substrate 10 may be located within the orthographic projection of the gate on the first substrate 10. The second electrode 111 and the first electrode 110 may be formed after the active layer 112 is formed, a part of the first electrode 110 may overlap with the drain doped region of the active layer 112, and another part of the first electrode 110 may be located on the sub-pixel region A2 to be connected with the pixel electrode 14. A part of the second electrode 111 may overlap with the source doped region of the active layer 112, and another part of the second electrode 111 may be connected to the data line 16.

It should be noted that the transistor 11 of the embodiments of the present disclosure is not limited to the bottom gate type mentioned above, but may also be of a top gate type. That is, the gate is formed after the active layer 112 is formed and before the second electrode 111 and the first electrode 110 are formed. It should be understood that one gate insulation layer 19 is respectively formed between the gate and the active layer 112 and between the gate and the first (second) electrode. When the transistor 11 is of the top gate type, the second electrode 111 and the first electrode 110 may respectively pass through a transition via-hole, that is, penetrating through the transition via-hole of two gate insulation layers 19 and being connected to the opposite two ends of the active layer 112.

Among them. after the second electrode 111 and the first electrode 110 are formed, the aforementioned organic insulation layer 12 may be formed. The organic insulation layer 12 is arranged on the first substrate 10 in a whole layer and covers the aforementioned active layer 112, the second electrode 111, the first electrode 110, the data line 16, the scanning line 17, the common line 18.

In some embodiments of the present disclosure, the pixel electrode 14 and the common electrode 15 of each sub-pixel unit are both located on the first substrate 10, and at least part of the pixel electrode 14 and the common electrode 15 of each sub-pixel unit are located in a sub-pixel region A2. The orthographic projection of the pixel electrode 14 on the first substrate 10 partially overlaps with the orthographic projection of the common electrode 15 on the first substrate 10, and the pixel electrode 14 is connected to the first electrode 110 of the transistor 11. Specifically, one of the pixel electrode 14 and the common electrode 15 is located on the side of the organic insulation layer 12 close to the first substrate 10, and the other is located on the side of the organic insulation layer 12 away from the first substrate 10.

For example, the common electrode 15 of the embodiments of the present disclosure may be located on the side of the organic insulation layer 12 close to the first substrate 10, and the pixel electrode 14 may be located on the side of the organic insulation layer 12 away from the first substrate 10. Among them, the common electrode 15 and the pixel electrode 14 in some embodiments of the present disclosure are both transparent electrodes, which may be made of a material of indium tin oxide (ITO), which is not limited to this and may be made of transparent materials such as indium zinc oxide (IZO) and zinc oxide (ZnO).

The common electrode 15 of the embodiments of the present disclosure may be a plate-shaped electrode, that is, it is not subjected to a patterned slit processing. The pixel electrode 14 may be a slit electrode, that is, it is subjected to a patterned slit processing.

Figure 3:
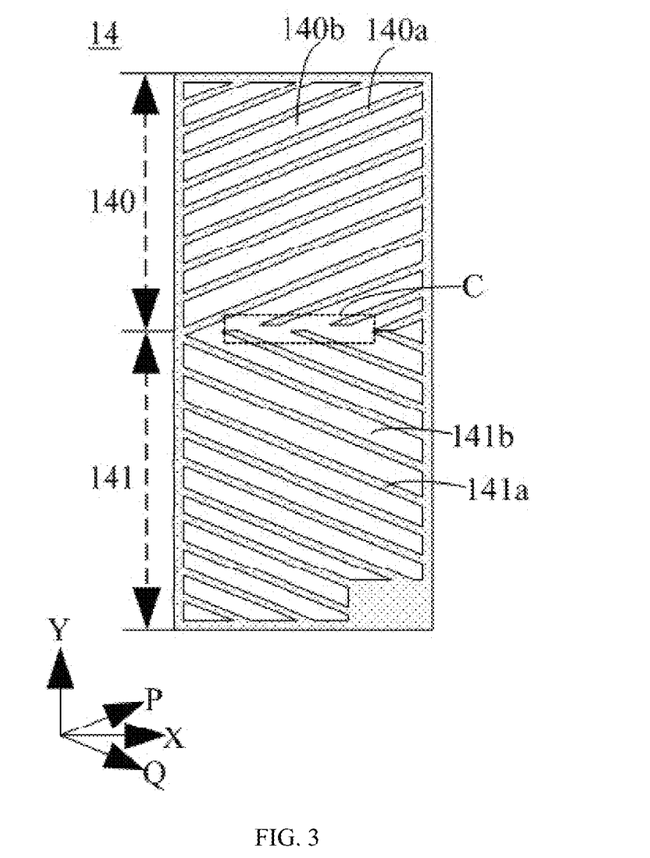
FIG. 3 is a schematic structural diagram of a pixel electrode in the array substrate shown in FIG. 1.

Specifically, as shown in FIG. 3, the pixel electrode 14 includes a first portion 140 and a second portion 141 arranged in the column direction Y and integrally formed. The first portion 140 includes first electrode strips 140a and first slits 140b alternately arranged in the column direction Y. The second portion 141 includes second electrode strips 141a and second slits 141b alternately arranged in the column direction Y. The extension direction of the first electrode strip 140a and the first slit 140b is defined as the third direction P. The extending direction of the second electrode strip 141a and the second slit 141b is defined as the fourth direction Q. It should be noted that the third direction P and the fourth direction Q intersects with each other and are mirror symmetrical with respect to the row direction X. By providing two kinds of slits extending in different directions, the color shift can be reduced and the display effect can be improved.

Optionally, in at least a middle area of a junction region C (as shown in FIG. 3) where the first part 140 and the second part 141 meet, the first electrode strip 140a and the second electrode strip 141a are disconnected, which can improve the transmittance.

It should be noted that in some embodiments of the present disclosure, the first slit 140b and the second slit 141b are closed at both ends of their extending direction in regions other than at least the intermediate region C (as shown in FIG. 3) where the first portion 140 and the second portion 141 meet.

In some embodiments of the present disclosure, the common electrode 15 may be fabricated on the first substrate 10 prior to the scanning line 17 and the common line 18. That is, the common electrode 15 may be fabricated on the first substrate 10 first, and then the scanning line 17 and the common line 18 may be fabricated. A portion of the common line 18 is located on the side of the common electrode 15 away from the first substrate 10 and in contact with the common electrode 15. That is, the part of the common line 18 may be overlapped on the side of the common electrode 15 away from the first substrate 10, so that the common line 18 provides a common signal to the common electrode 15 of the sub-pixel unit.

The pixel electrode 14 may be formed after the organic insulation layer 12 is formed. That is, the organic insulation layer 12 is formed on the first substrate 10 first, and then the pixel electrode 14 is formed. The pixel electrode 14 may be connected to the first electrode 110 of the transistor 11 through a via-hole structure S (as shown in FIG. 1) on the organic insulation layer 12.

Among them, as shown in FIG. 2, since the pixel electrode 14 and the common electrode 15 are located on both sides of the organic insulation layer 12 respectively, in order to ensure that a sufficient electric field is formed between the pixel electrode 14 and the common electrode 15, the thickness of the organic insulation layer 12 between the pixel electrode 14 and the common electrode 15 can be set to be smaller. In order to ensure the flatness of the transistor 11, the thickness of the organic insulation layer 12 at the transistor 11 can be set to be larger. Based on this, when fabricating the organic insulation layer 12, it is necessary to fabricate at least two kinds of organic insulation portions with different thicknesses, such as the first organic insulation portion 120 and the second organic insulation portion 121. The orthographic projection of the first organic insulation portion 120 on the first substrate 10 covers the orthographic projection of the transistor 11 on the first substrate 10. The orthographic projection of the second organic insulation portion 121 on the first substrate 10 covers the orthographic projection of the pixel electrode 14 and the common electrode 15 on the first substrate 10. The thickness H1 of the first organic insulation portion 120 is larger than the thickness H2 of the second organic insulation portion 121.

For example, the ratio of the thickness H1 of the first organic insulation portion 120 to the thickness H2 of the second organic insulation portion 121 may be 2 to 4, such as 2, 2.5, 3, 3.5, 4, etc. In this way, while ensuring the flatness of the transistor 11 and the electric field strength of the sub-pixel region A2, the situation can also be avoided that the stability of the organic insulation layer 12 is poor due to the excessive difference in thickness between the first organic insulation portion 120 and the second organic insulation portion 121.

The thickness H1 of the first organic insulation portion 120 may be 1 μm to 3 μm. for example, 1 μm, 1.5 μm, 2 μm, 2.5 μm, 3 μm, etc. The thickness H2 of the second organic insulation portion 121 may be 0.8 μm to 1.5 μm, for example, 0.8 μm, 1 μm, 1.2 μm, 1.5 μm and so on.

It should be noted that in order to make the organic insulation layer 12 have portions with different thicknesses, the organic insulation layer 12 can be fabricated by a half tone mask (HTM) process.

In some embodiments of the present disclosure, since the organic film material has a higher resistivity than inorganic materials such as silicon nitride, the interference of the data line 16 and the scanning line 17 to the pixel electrode 14 is further reduced, and the load of the data line 16 and the scanning line 17 is also reduced.

Among them. the ratio of the width of the scanning line 17 to the thickness of the aforementioned first organic insulation portion 120 in some embodiments of the present disclosure may be 3 to 20, for example, 3, 6, 9, 12, 15, 18, 20, etc. The ratio of the width of the data line 16 to the thickness of the first organic insulation portion 120 may be 1.5 to 6.5, such as 1.5, 3, 4.5, 6, 6.5, etc.

For example, the width of the scanning line 17 may be 10 μm to 20 μm, such as 10 μm, 12 μm, 14 μm, 16 μm, 18 μm, 20 μm, etc. The width of the data line 16 is 5 μm to 6.5 μm, such as 5 μm, 5.5 μm, 6 μm, 6.5 μm, etc. Such a design can reduce the load of the data line 16 and the scanning line 17, and also help to improve the opening rate of the panel, thereby improving the transmittance of the panel.

In some embodiments of the present disclosure, a row of scanning lines 17 and a row of common lines 18 may be provided on each first wiring region A1, and a column of data lines 16 may be provided on each second wiring region A3, where each row of scanning lines 17 is connected to the transistor 11 of the adjacent sub-pixel unit in the same row. Each row of the common lines 18 overlaps with the common electrode 15 of the adjacent sub-pixel unit in the same row. Each column of data lines 16 is connected to the second electrode 111 of the transistor 11 of the sub-pixel unit located in an even row in one column of sub-pixel units adjacent to it, and is connected to the second electrode 111 of the transistor 11 of the sub-pixel unit located in an odd row in another column of sub-pixel units adjacent to it. But it is not limited to this, and each column of data lines 16 is only connected to the second electrode 111 of the transistor 11 of each sub-pixel unit in the same column of sub-pixel units adjacent to it.

It should be noted that the array substrate 1 according to the embodiments of the present disclosure may further include a jumper line (not shown in the figures) provided on the same layer as the data line 16. This jumper line may connect the common electrodes 15 of two adjacent sub-pixel units in the column direction Y through a via-hole structure.

In some embodiments of the present disclosure, as shown in FIG. 2, the spacer 13 may be in contact with the organic insulation layer 12, specifically, may be in contact with the first organic insulation portion 120 of the organic insulation layer 12.

In addition, the orthographic projection of the spacer 13 on the first substrate 10 according to embodiment of the present disclosure may at least partially overlap with the orthographic projection of the data line 16 on the first substrate 10 and at least partially overlap with the orthographic projection of the scanning line 17 on the first substrate 10, in addition to overlapping with the orthographic projection of the transistor 11 on the first substrate 10. In this way, the opening rate of the panel can be further effectively improved, thereby improving the panel transmittance.

Among them, the array substrate 1 according to the embodiments of the present disclosure may further include an alignment film layer (not shown in the figures), which may be located at the top layer of the array substrate 1, that is, the alignment film layer is arranged in a whole layer and covers the pixel electrode 14 and the spacer 13.

It should be noted that, as shown in FIG. 2, in some embodiments of the present disclosure, the orthographic projection of the surface of the spacer 13 away from the first substrate 10 on the first substrate 10 is located within the orthographic projection of the surface of the spacer 13 close to the first substrate 10 on the first substrate 10. This design can reduce the contact area between the spacer 13 and the alignment substrate after the alignment substrate and the array substrate 1 are cell aligned with each other, thereby reducing the friction force between the spacer 13 and the alignment substrate, and ensuring that the spacer 13 can be quickly reset.

Figure 5:
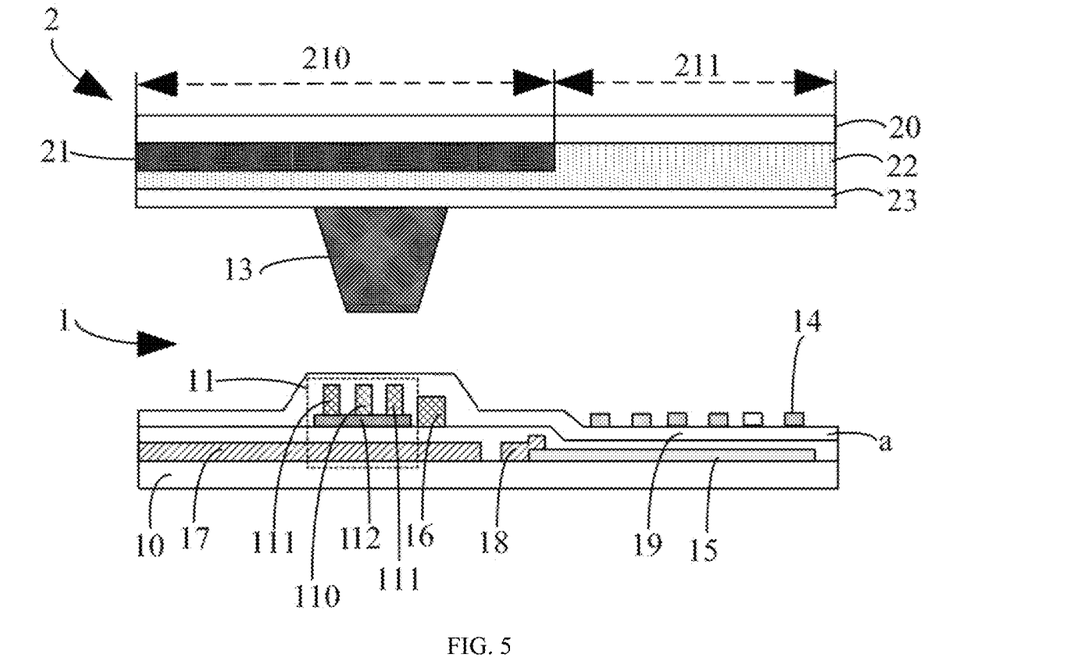
FIG. 5 is a schematic diagram of the alignment relationship between the array substrate and the alignment substrate in the related art.

There, experiments show that the array substrate 1 provided in some embodiments of the present disclosure can effectively improve the opening rate of the panel, and thus the panel transmittance, compared with the scheme that the spacer 13 mentioned in the related art is on the alignment substrate 2 and its orthographic projection on the array substrate 1 is only on the scanning line 17, and the scheme that the inorganic insulation layer a is used on the array substrate 1 to cover the transistors 11 (as shown in FIG. 5), referring to Table 1 below for details.

TABLE 1

| | Test product | | |
|---|---|---|---|
| | 65 inch 4K 60 Hz | 75 inch 4K 60 Hz | 75 inch 8K 60 Hz |
| Test item | Transmittance | | |
| Panels of related art | 5.1% | 5.7% | 3.5% |
| Panels of the present disclosure | 5.6% | 6.2% | 3.8% |

Based on this table, it can be seen that when the panel is a 65 inch 4K 60 Hz model, the transmittance of the panel of the present disclosure is about 11% higher than that of the panel of the related art, when the panel is a 75 inch 4 k 60 hz model, the transmittance of the panel of the present disclosure is about 8% higher than that of the panel of the related art, and when the panel is a 75 inch 8K 60 Hz model, the transmittance of the panel of the present disclosure is about 8% higher than that of the panel of the related art.

In some embodiments of the present disclosure, a plurality of spacers 13 can be provided on the array substrate 1, divided into a main spacer and an auxiliary spacer. When the panel does not receive external pressure, both ends of the main spacer can be in contact with the array substrate 1 and the alignment substrate respectively, mainly playing a supporting role. When the display panel does not receive external pressure, if the auxiliary spacer is formed on the array substrate 1, there is a certain distance between the side of the auxiliary spacer away from the first substrate 10 and the alignment substrate, that is, there is a height difference of segment difference between the main spacer and the auxiliary spacer. By adjusting the segment difference between the main spacer and the auxiliary spacer, the thickness of the display panel can be finely adjusted.

For example, in the direction of the thickness of the panel, the height of the main spacer is greater than the height of the auxiliary spacer. When the display panel is subjected to external pressure, the main spacer first bears all the pressure and is compressed. When the main spacer is compressed until the segment difference between the main spacer and the auxiliary spacer drops to 0, the main spacer and the auxiliary spacer bear the external pressure together.

It should be noted that the main spacers and the auxiliary spacers can be arranged in a certain period. It is necessary to monitor the size and height of different types of spacers 13 in the process of manufacturing. Since the size of the spacer is small, and generally there are few main spacers, it is difficult for the equipment to accurately identify the position of the main spacers by relying on the size alone. Generally, a certain position around the main spacers is designed with no spacer (that is, no spacer is provided), so as to identify the position of the main spacer more quickly and accurately and monitor it. For example, in the design, no spacer is set under the main spacer, the position with no spacer being set can be quickly determined first, and then the spacer above the position with no spacer being set can be defined as the main spacer according to the aforementioned design rules.

Figure 4:
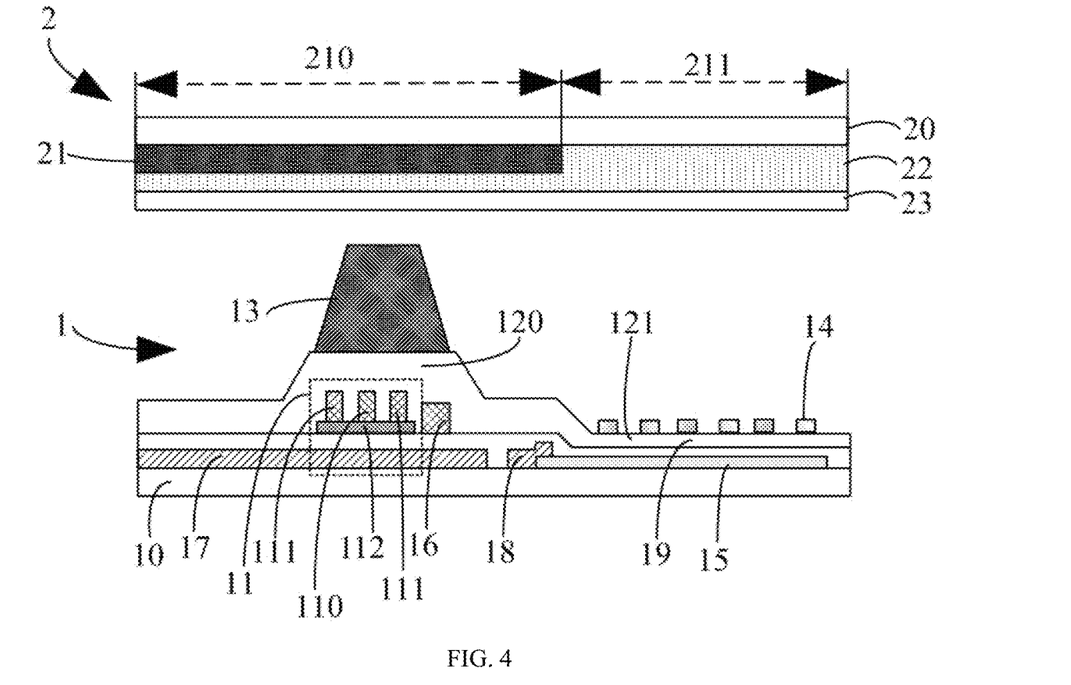
FIG. 4 is a schematic diagram of the alignment relationship between the array substrate and the alignment substrate shown in FIG. 2.

Embodiments of the present disclosure also provide a display device, which includes the array substrate 1 mentioned in any of the foregoing embodiments, and will not be repeated here. As shown in FIG. 4, the display device may further include an alignment substrate 2 that is arranged in alignment with the array substrate 1. The display device may further include a liquid crystal layer (not shown) between the array substrate 1 and the alignment substrate 2, that is, the display device may be a liquid crystal display device. Among them, the liquid crystal molecules of the liquid crystal layer may be negative liquid crystal to improve the transmittance, which is not limited here and may also be positive liquid crystal.

In some embodiments of the present disclosure, the alignment substrate 2 may include a second substrate 20 and a shielding layer 21 located on the side of the second substrate 20 close to the array substrate 1. The structure of the second substrate 20 may be the same as that of the first substrate 10, which can be referred to the description of the first substrate 10, and is not limited here. The structure of the second substrate 20 may be different from that of the first substrate 10, depending on the specific situation. The shielding layer 21 defines a shielding region 210 and a light transmitting region 211. A plurality of light transmitting regions 211 are provided and correspond to the sub-pixel units one-to-one. The orthographic projection of the light transmitting region 211 on the first substrate 10 is located within the orthographic projection of the pixel electrode 14 and the common electrode 15 on the first substrate 10. The orthographic projection of the shielding region 210 on the first substrate 10 completely covers the transistor 11, the scanning line 17, the data line 16, the common line 18, and the spacer 13. The shielding region 210 can also cover the edges of the common electrode 15 and the pixel electrodes 14.

It should be noted that the alignment substrate 2 can also be provided with a color film layer 22 (not shown in the figures) with red color blocks, green color blocks and blue color blocks, and a transparent protective layer covering the color film layer 22. The color film layer 22 can be formed on the second substrate 20 after the shielding layer 21 is formed, and then a transparent protective layer 23 is formed after the color film layer 22 is formed. The alignment substrate 2 may also be provided with an alignment film layer, which is located on the side of the transparent protective layer 23 away from the second substrate 20 and is arranged in a whole layer.

It should be understood that, the color film layer 22 may be located not only on the alignment substrate 2, but also on the array substrate 1, depending on the specific situation.

According to the embodiments of the present disclosure, the specific type of the display device is not particularly limited, which can be the type of the display device commonly used in the art, for example, liquid crystal display, mobile devices such as mobile phones and notebook computers, wearable devices such as watches, VR devices, etc. Those skilled in the art can make corresponding choices according to the specific uses of the display device, which will not be repeated here.

It should be noted that, in addition to the display panel, the display device also includes other necessary components and compositions. Taking the display as an example, it can also include a backlight module, a housing, a main circuit board, a power cord, etc. Those skilled in the art can make corresponding supplements according to the specific use requirements of the display device, which will not be repeated here.

It should be noted that "on", "formed on" and "set on" mentioned in the context can mean that one layer is directly formed or set on another layer, or it can mean that one layer is indirectly formed or set on another layer, that is, there are other layers between the two layers.

The terms "a", "one", "the", "said" and "at least one" are used to indicate the existence of one or more elements/components/etc. The terms "include" and "have" are used to indicate an open-ended inclusion and mean that there may be other elements/components/etc. in addition to the listed elements/components/etc.

It should be noted that although the terms "first", "second" and so on can be used here to describe various components, members, elements, regions, layers and/or parts, these components, members, elements, regions, layers and/or parts should not be limited by these terms. Rather, these terms are used to distinguish one component, member, element, region, layer, and/or part from another.

After considering the description and practicing the invention disclosed herein, those skilled in the art will easily think of other embodiments of the disclosure. The present disclosure is intended to cover any variations, uses or adaptive changes of the present disclosure, which follow the general principles of the present disclosure and include common general knowledge or commonly used technical means in the technical field not disclosed in the present disclosure. The description and the embodiments should be regarded as exemplary, and the true scope and spirit of the present disclosure are indicated by the appended claims.

It should be understood that the present disclosure is not limited to the precise structure already described above and shown in the drawings, and various modifications and changes can be made without departing from its scope. The scope of the present disclosure is limited only by the appended claims.

What is claimed is:

1. An array substrate, comprising:
    a first substrate;
    a transistor, formed on the first substrate;
    an organic insulation layer, formed on the first substrate and covering the transistor;
    a spacer, formed on a side of the organic insulation layer away from the first substrate, wherein, an orthographic projection of the spacer on the first substrate at least partially overlaps with an orthographic projection of the transistor on the first substrate, the spacer is in direct contact with a portion of the organic insulation layer covering the transistor and provided with a greater thickness than other portion of the organic insulation layer; and
    a pixel electrode, wherein the pixel electrode comprises a first portion and a second portion arranged in a column direction and integrally formed; the first portion comprises a first electrode strip and a first slit alternately arranged in the column direction; the second portion comprises a second electrode strip and a second slit alternately arranged in the column direction; the first electrode strip and the first slit extend along a third direction; the second electrode strip and the second slit extend along a fourth direction; the third direction and the fourth direction intersect with each other and are mirror symmetric with respect to a row direction; and the first slit and the second slit are closed at both ends of their extending direction in regions other than at least an intermediate region where the first portion and the second portion meet;
    a common line, extending in the row direction, the common line and a gate of the transistor are arranged on a same layer, an orthographic projection of the common line on the first substrate does not overlap with an orthographic projection of the gate of the transistor on the first substrate;
    a data line, extending in a column direction, wherein the data line is connected to a second electrode of the transistor; and
    a scanning line, extending in a row direction, wherein the scanning line is connected to a gate of the transistor;
    wherein the orthographic projection of the spacer on the first substrate at least partially overlaps with an orthographic projection of the data line on the first substrate, and at least partially overlaps with an orthographic projection of the scanning line on the first substrate.

2. The array substrate according to claim 1, wherein the array substrate further comprises a common electrode,
    an orthographic projection of the pixel electrode on the first substrate partially overlaps with an orthographic projection of the common electrode on the first substrate, and the pixel electrode is connected to a first electrode of the transistor;
    one of the pixel electrode and the common electrode is located on a side of the organic insulation layer close to the first substrate, and the other one of the pixel electrode and the common electrode is located on a side of the organic insulation layer away from the first substrate.

3. The array substrate according to claim 2, wherein the organic insulation layer comprises a first organic insulation portion and a second organic insulation portion,
    an orthographic projection of the first organic insulation portion on the first substrate covers the orthographic projection of the transistor on the first substrate;
    an orthographic projection of the second organic insulation portion on the first substrate covers an orthographic projection of the pixel electrode and the common electrode on the first substrate;
    wherein a thickness of the first organic insulation portion is greater than a thickness of the second organic insulation portion.

4. The array substrate according to claim 3, wherein a ratio of the thickness of the first organic insulation portion to the thickness of the second organic insulation portion is 2 to 4.

5. The array substrate according to claim 3, wherein the thickness of the first organic insulation portion is 1 µm to 3 µm; and the thickness of the second organic insulation portion is 0.8 µm to 1.5 µm.

6. The array substrate according to claim 1, wherein,
    a ratio of a width of the scanning line to the thickness of the first organic insulation portion is 3 to 20; and
    a ratio of a width of the data line to the thickness of the first organic insulation portion is 1.5 to 6.5.

7. The array substrate according to claim 6, wherein the width of the scanning line is 10 µm to 20 µm, and the width of the data line is 5 µm to 6.5 µm.

8. The array substrate according to claim 1, wherein a part of the scanning line is configured to form the gate of the transistor, the data line is arranged on a same layer as the second electrode and the first electrode of the transistor, and is connected to the second electrode of the transistor.

9. The array substrate according to claim 2, wherein the common electrode is located on the side of the organic insulation layer close to the first substrate; and the pixel electrode is located on the side of the organic insulation layer away from the first substrate.

10. The array substrate according to claim 9, wherein the first electrode strip and the second electrode strip are disconnected in at least a middle area of a junction region where the first part and the second part meet.

11. The array substrate according to claim 9, wherein
    a part of the common line is located on a side of the common electrode away from the first substrate, and is in contact with the common electrode.

12. The array substrate according to claim 1, wherein an orthographic projection of a surface of the spacer away from the first substrate on the first substrate locates within an orthographic projection of a surface of the spacer close to the first substrate on the first substrate.

13. The array substrate according to claim 1, wherein the spacer is in contact with the organic insulation layer.

14. A display device, comprising an array substrate and an alignment substrate in cell alignment with the array substrate; wherein the array substrate comprises:
    a first substrate;

a transistor, formed on the first substrate;
an organic insulation layer, formed on the first substrate and covering the transistor;
a spacer, formed on a side of the organic insulation layer away from the first substrate, wherein, an orthographic projection of the spacer on the first substrate at least partially overlaps with an orthographic projection of the transistor on the first substrate, the spacer is in direct contact with a portion of the organic insulation layer covering the transistor and provided with a greater thickness than other portion of the organic insulation layer; and
a pixel electrode, wherein the pixel electrode comprises a first portion and a second portion arranged in a column direction and integrally formed; the first portion comprises a first electrode strip and a first slit alternately arranged in the column direction; the second portion comprises a second electrode strip and a second slit alternately arranged in the column direction; the first electrode strip and the first slit extend along a third direction; the second electrode strip and the second slit extend along a fourth direction; the third direction and the fourth direction intersect with each other and are mirror symmetric with respect to a row direction; and the first slit and the second slit are closed at both ends of their extending direction in regions other than at least an intermediate region where the first portion and the second portion meet;
a common line, extending in the row direction, the common line and a gate of the transistor are arranged on a same layer, an orthographic projection of the common line on the first substrate does not overlap with an orthographic projection of the gate of the transistor on the first substrate;
a data line, extending in a column direction, wherein the data line is connected to a second electrode of the transistor; and
a scanning line, extending in a row direction, wherein the scanning line is connected to a gate of the transistor;
wherein the orthographic projection of the spacer on the first substrate at least partially overlaps with an orthographic projection of the data line on the first substrate, and at least partially overlaps with an orthographic projection of the scanning line on the first substrate.

15. The display device according to claim 14, wherein the array substrate further comprises a common electrode,
an orthographic projection of the pixel electrode on the first substrate partially overlaps with an orthographic projection of the common electrode on the first substrate, and the pixel electrode is connected to a first electrode of the transistor;
one of the pixel electrode and the common electrode is located on a side of the organic insulation layer close to the first substrate, and the other one of the pixel electrode and the common electrode is located on a side of the organic insulation layer away from the first substrate.

16. The display device according to claim 15, wherein the organic insulation layer comprises a first organic insulation portion and a second organic insulation portion,
an orthographic projection of the first organic insulation portion on the first substrate covers the orthographic projection of the transistor on the first substrate;
an orthographic projection of the second organic insulation portion on the first substrate covers an orthographic projection of the pixel electrode and the common electrode on the first substrate;
wherein a thickness of the first organic insulation portion is greater than a thickness of the second organic insulation portion.

17. The display device according to claim 15, wherein the common electrode is located on the side of the organic insulation layer close to the first substrate; and the pixel electrode is located on the side of the organic insulation layer away from the first substrate.

18. The display device according to claim 14, wherein an orthographic projection of a surface of the spacer away from the first substrate on the first substrate locates within an orthographic projection of a surface of the spacer close to the first substrate on the first substrate.

* * * * *